United States Patent [19]
Sugibayashi et al.

[11] Patent Number: 5,732,026
[45] Date of Patent: Mar. 24, 1998

[54] SEMICONDUCTOR MEMORY DEVICE INCLUDING MAIN/SUB-BIT LINE ARRANGEMENT

[75] Inventors: Tadahiko Sugibayashi; Isao Naritake, both of Tokyo, Japan

[73] Assignee: NEC Corporation, Tokyo, Japan

[21] Appl. No.: 713,692

[22] Filed: Sep. 13, 1996

[30] Foreign Application Priority Data

Sep. 14, 1995 [JP] Japan .................. 7-236508

[51] Int. Cl.$^6$ .................................................. G11C 7/00
[52] U.S. Cl. ................... 365/189.05; 365/190; 365/205; 365/230.03
[58] Field of Search .................. 365/238.5, 190, 365/205, 189.05, 230.03

[56] References Cited

U.S. PATENT DOCUMENTS 5,274,598   12/1993   Fujii et al. .................. 365/205
5,353,255   10/1994   Komuro ....................... 365/208

Primary Examiner—David C. Nelms
Assistant Examiner—Andrew Q. Tran
Attorney, Agent, or Firm—Sughrue, Mion, Zinn, Macpeak & Seas, PLLC

[57] ABSTRACT

A semiconductor memory device including a plurality of sub-bit lines, a sense amplifier provided in common to the plurality of sub-bit lines which receives a data signal from a first one of the plurality of sub-bit lines, a main-bit line operatively coupled to the sense amplifier to receive an output of the sense amplifier, and a data latch circuit provided to latch data appearing on the main-bit line. The device further comprises a circuit for transferring a data signal of a second one of the plurality of sub-bit lines to the sense amplifier when the data latch circuit is being accessed to read out data latched in the data latch circuit.

8 Claims, 10 Drawing Sheets

SEMICONDUCTOR MEMORY DEVICE INCLUDING MAIN/SUB-BIT LINE ARRANGEMENT

BACKGROUND OF THE INVENTION

The present invention relates to a semiconductor memory device and, more specifically, to a dynamic random access memory (DRAM) having memory cells each constructed of 1 (one) transistor and 1 (one) capacitor.

DRAMs have been increased in integration density year by year, so that DRAMs of 1G bits have been developed. In order to increase memory capacities, the area of each cell must be reduced along with the line pitches of word lines and of bit lines. As is well known in the field of DRAMs, data stored in an accessed memory cell should be sensed so as to be read. This data should be rewritten into the memory cell. Furthermore, data stored each memory cell connected to the same word line must be sensed and rewritten in other memory cells connected to that word line. The above-explained operation is carried out by sense amplifiers. Since the sense amplifiers are constituted by a plurality of transistors, regions shared by these sense amplifiers impede a reduction of the pitches of bit lines.

Accordingly, it is conceivable that a plurality of bit lines are commonly used by a single-sense amplifier. However, in this case, the data should be rewritten into a plurality of memory cells connected to the selected word line in a time divisional manner. Accordingly, this idea is not adapted to a memory in which access addresses are changed in a non-continuous manner. To the contrary, for instance, this idea may be realized as a file memory. In a file memory, when access addresses are changed in a continuous manner, the change in the address can respond to the above-described time divisional control of data sensing/data writing operations. Thus, it is possible to provide file memories with large storage capacities.

FIG. 1 schematically shows the above-described one conventional DRAM. It should be noted that in this DRAM bit lines are constructed in a main-bit/sub-bit line arrangement, and a single sense amplifier is commonly used by a plurality of sub-bit lines. This DRAM owns a memory block MB and a peripheral circuit thereof. This memory block MB will be discussed later in detail with reference to FIG. 2. A plurality of main-bit line pairs MBL-i, MBLb-i (i=0, 1, - - - ) are connected to this memory block MB. These main-bit line pairs MBL and MBLb are connected to a corresponding one of the switch circuits 10-i. These switch circuits 10-i are commonly connected via data bus pair DB, DBb to a data read/write amplifier 14. The data read/write amplifier 14 is connected via an input/output buffer 15 to an input/output pin 16, so that data is transmitted between the data read/write amplifier 14 and the input/output pin 16. One switch circuit of the switch circuits 10-i is selected by an address in response to a switch selecting signal YSW-i sent from a column decoder 12. A word line selecting signal SWL and memory switching signals $TG_0$ to $TG_3$ are supplied from a row decoder 13 to the memory block MB.

The operations of this peripheral circuit are the same as those of the usual DRAM. That is, the row decoder 13 drives one word line selecting signal $SWL_{00}$ based on the address information. In response to this driving operation, data of the selected memory cell are read to the respective main bit line pair MBL, MBLb. On the other hand, the column decoder 12 selects the main bit line pair MBL, MBLb via one switch circuit 10 to be connected with the data bus pair DB, DBb. The input/output buffer 15 outputs the read data to the input/output pin 16 based upon the data appearing on the selected main bit line pair MBL, MBLb in the data read mode, whereas the data amplifier 14 drives the main bit line pair based on the write data to the input/output pin 16 in the data write mode.

In FIG. 2, there is shown an arrangement related to the main bit line pair MBL-0, MBLb-0 as a portion of the memory block MB. This memory block is a so-called "open bit system". Four sub-bit lines $SBL_0$ to $SBL_3$ are extended on both sides of a single sub-sense amplifier 17a, while commonly using this sub-sense amplifier 17a. The word line SWL is intersected with these bit lines $SBL_0$ to $SBL_3$, and then a DRAM memory cell MC constructed of one transistor and one capacitor is provided with each of cross points. Since one sense amplifier 17a is commonly used, the sub-bit lines $SBL_0$ to $SBL_3$ are connected via pMOS transistors $T_{TG0}$ to $T_{TG3}$ to the sub-sense amplifier 17a, and these transistors $T_{TG0}$ to $T_{TG3}$ are turned ON/OFF in response to the memory switching signals $TG_0$ to $TG_3$. The sub-sense amplifier 17a includes a precharge circuit $P_2$ for precharging this one pair of input/output nodes, and NMOS transistors $T_{n20}$ and $T_{n21}$ for amplifying the level of the selected sub-bit line. This sub-sense amplifier 17a further contains nMOS transistors $T_{n22}$ to $T_{n25}$ for controlling connection/disconnection between the selected sub-bit line and main bit line pair MBL-0, MBLb-0. The nMOS transistors $T_{n22}$ and $T_{n23}$ are made conductive by the signal RS when the amplified level of the sub-bit line is transferred to the main bit line, whereas the nMOS transistors $T_{n24}$ and $T_{n25}$ are made conductive by the signal WS when the data is rewritten. A main sense amplifier 18a is connected to the main bit line pair MBL-0 and MBLb-0. This main sense amplifier 18a includes a main bit line precharge circuit $P_1$, pMOS transistors $T_{p20}$, $T_{p21}$ and nMOS transistors $T_{n26}$, $T_{n27}$, which are provided between sense amplifier drive lines SAP and SAN, and are connected to form a flip-flop. Each of the precharge circuits $P_1$ and $P_2$ precharges the input/output mode of the corresponding sense amplifier to a Vcc/2-level.

Referring now to a timing chart of FIG. 3, data reading operation of this DRAM will be described.

In a reset period before the data reading operation, all of the word lines SWL and the memory switching signals TG are at low levels, and the input/output modes of the respective sense amplifiers are precharged to Vcc/2.

Next, the precharge circuit P1, P2 becomes inactive, and one word line, for instance, $SWL_{00}$ is selected to become a high level. Furthermore, the switching signal $TG_0$ becomes a low level. As a result, a memory cell MC000 located at a cross point between this word line $SWL_{00}$ and the sub-bit line $SBL_0$ is selected, and thus, the potential of the sub-bit line $SBL_0$ becomes such a potential corresponding to the data stored in this selected memory cell $MC_{000}$. On the other hand, the sub-line line $SBL_0$ located on the lower side of the sub-sense amplifier 17a holds the precharge level. Accordingly, a potential difference is produced at the input/output mode of the sub-sense amplifier 17a. Under this condition, the read signal RS becomes active, so that the transistors $T_{n22}$ and $T_{n23}$ are made conductive. As a consequence, this potential difference is transferred to the main-bit line pair MBL and MBLb. The sense amplifier drive lines SAP and SAN becomes active levels, and the levels of the main bit line pair MBL and MBLb are amplified by the main sense amplifier 18a.

Thereafter, the read signal RS becomes a low level and the write signal WS becomes a high level, and the respective levels of the main-bit line pair MBL, MBLb are transferred via the transistors $T_{n24}$ and $T_{n25}$ to the sub-bit line $SBL_0$, so that the data is rewritten into the memory cell $MC_{000}$.

It should be understood that in this memory block MB all of the upper circuit portions from the main sense amplifier 18a are made by the nMOS structure so as to further reduce the chip area. As a result, the sub-sense amplifier 17a does not have the ability to rewrite data. However, if a slight increase in the chip area is allowable, then the sub-sense amplifier 17a may be substituted by the main-sense amplifier 18a.

On the other hand, in the peripheral circuit, the addresses to the column decoder 12 are sequentially changed during a time period (t1) when the write signal WS is at the high level to thereby sequentially select a switch circuit 10-i, so that the data appearing on the main bit line pair MBL, MBLb are successively outputted. When the data transfer is ended, the writer signal WS is set to a low level, so that the respective main bit line pair MBL, MBLb are precharged to Vcc/2. Thereafter, as described above, the memory switching signal $TG_1$ becomes a high level, so that the data are read out in the continuous manner.

However, in the above-described memory, the respective main bit line pair MBL, MBLb must be precharged so as to be initialized every time the signals for causing the switching signals $TG_0$ to $TG_4$ to become the active levels are switched. Accordingly, the data cannot be continuously read from all of the cells connected to the selected work line, so that the rest time period is required in the data reading operation, as indicated by "$t_2$" of FIG. 3.

SUMMARY OF THE INVENTION

Therefore, an object of the present invention is to provide a semiconductor memory device, the reading efficiency of which is further increased, as compared with that of the conventional semiconductor memory device.

A semiconductor memory device of the present invention comprises a plurality of sub-bit lines; a sense amplifier provided in common to the plurality of sub-bit lines and receiving a data signal from a first one of the plurality of sub-bit lines; a main-bit line operatively coupled to the sense amplifier to receive an output of the sense amplifier; a data latch circuit provided to latch data appearing on the main-bit line and means for transferring a data signal of a second one of the plurality of sub-bit lines to the sense amplifier during the data latch circuit being accessed to read out data latched in the data latch circuit.

Another semiconductor memory device of the present invention comprises a plurality of sub-bit lines, a sense amplifier provided in common to the plurality of sub-bit lines; a main-bit line coupled to said sense amplifier; a data latch circuit temporarily latching first data to be written, first means for transferring the first data from the data latch circuit to the main bit line to thereby allow the sense amplifier to drive a first one of the sub-bit lines in response to the first data; and second means for disconnecting the data latch circuit from the main-bit line during the data latch circuit being controlled to latch second data to be written, to thereby allow the sense amplifier prepare driving a second one of the sub-bit lines in response to the second data.

As described above, once the data of the main bit line is latched by the latch circuit, the main bit become free. Therefore, the read data of the main-bit line need not be held. Accordingly, after the read data has been latched by the latch circuit, the main bit line can be initialized, so that the next sub-bit line can be accessed immediately. As a result, the initialization time period ($t_1$) of the main-bit line is not needed.

BRIEF DESCRIPTION OF THE DRAWINGS

The above and other objects, advantages, and features of the present invention will be more apparent from the following descriptions to be read in conjunction with the accompanying drawings, in which.

DETAILED DESCRIPTION OF THE PREFERRED EMBODIMENTS

Figure 1:
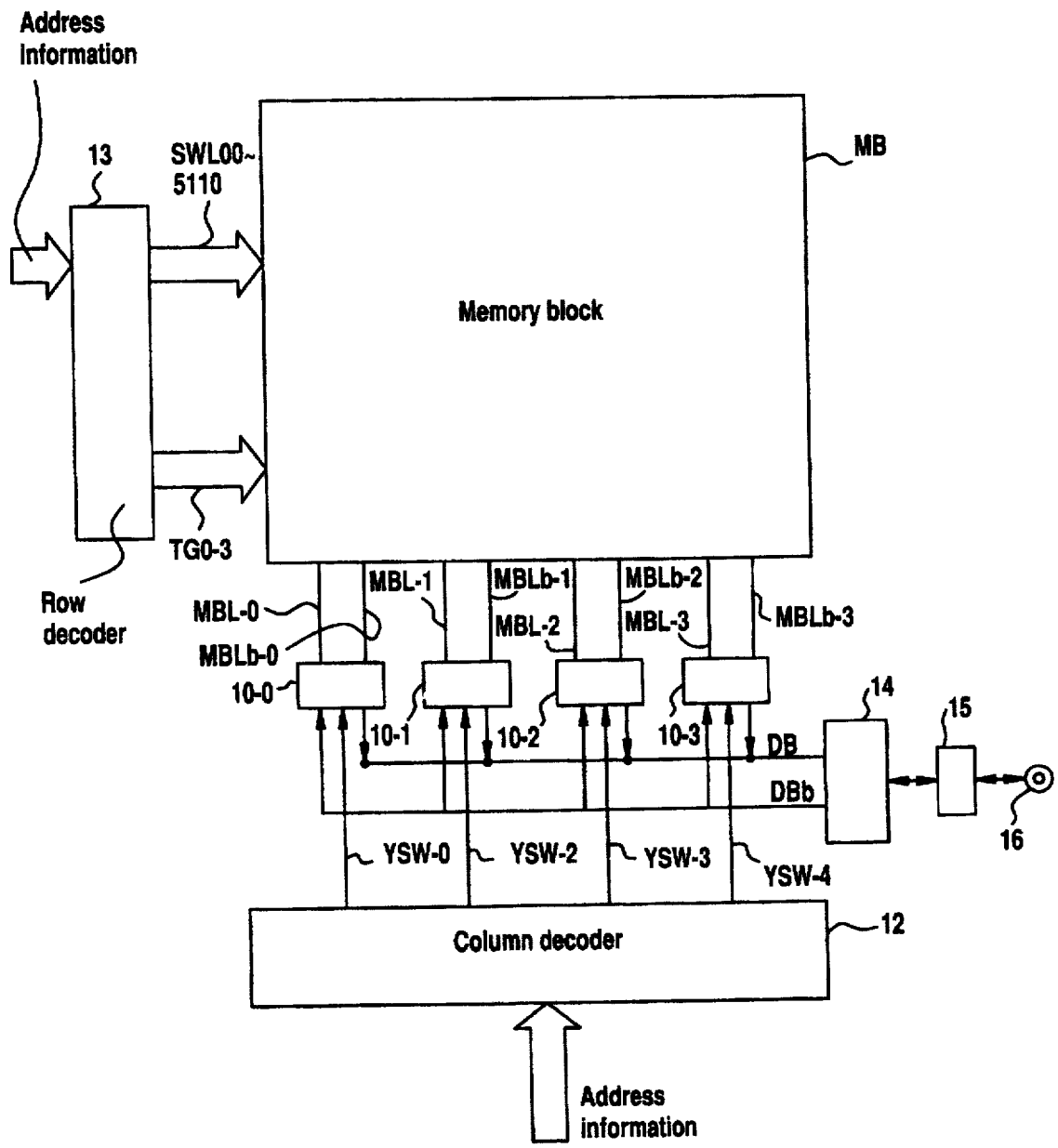
FIG. 1 is the schematic block diagram for showing the conventional DRAM.
Figure 4:
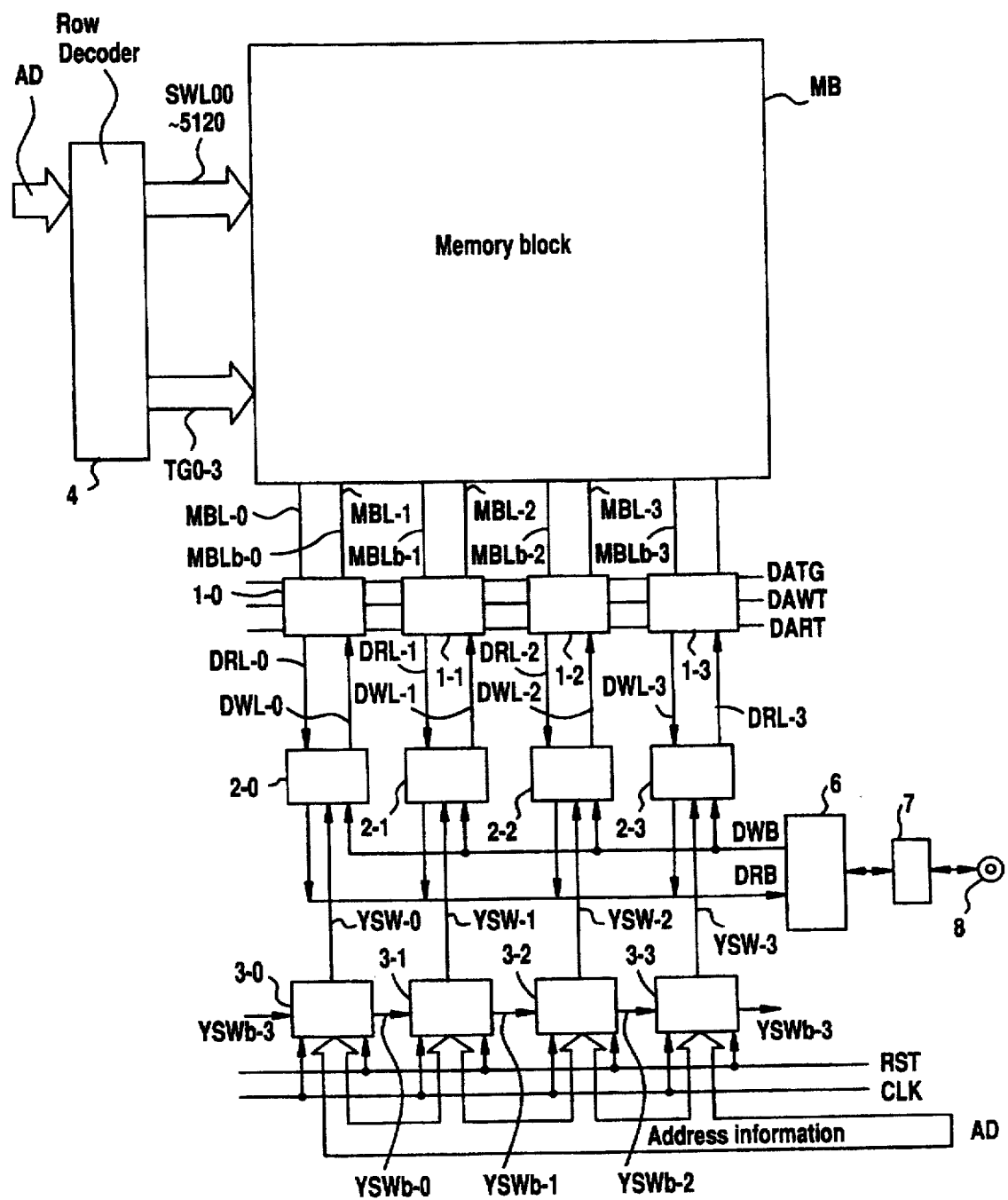
FIG. 4 is a schematic block diagram for showing a DRAM according to a first embodiment of the present invention.

FIG. 4 schematically represents a block diagram of a DRAM according to a first embodiment of the present invention. It should be noted that the same reference numerals shown in FIG. 1 will be employed for the same or similar constructive units. Therefore, explanations of those units are omitted. In this embodiment, the respective main-bit line pair MBL, MBLb derived from a memory block MB are connected to data latch circuits 1-i, respectively. A data write signal DAWT, a data read signal DART, and a data latch signal DATG are commonly supplied to each of the data latch circuits 1-i. When the signal DATG is in an active level, the main bit line pair MBL, MBLb are electrically connected to the data latch circuits 1-i. At this time, when a data read signal DART becomes an active level, data appearing on the main-bit line pair MBL, MBLb are latched in the data latch circuits 1-i and transferred to a data read line DRL. On the other hand, when the data write signal DAWT is in active level, the write data of the data write line DWL is latched in the data latch circuits 1-i and transferred to the main-bit line pair MBL, MBLb. The data read line DRL and the data write line DWL of are connected to switch circuits 2-i, respectively. These switch circuits 2-i are controlled in response to switch selecting signals YSW and connect lines DRL and DWL to a data read bus DRB and a data write bus DWB, respectively, when the signals YSW is at an active level. The respective switch selecting signals YSW are produced by switch selecting circuits 3-i. The switch selecting circuits 3-i produce a transfer signal which is complementary to the switch selecting signal YSW. The transfer signal YSWb of one of the circuits 3-i is input to the next one of the circuits 3-i. Furthermore, an address information AD, a clock signal CLK, and a reset signal RST are commonly supplied to the switch selecting circuits 3-i. The data read bus DRB and the data write bus DWB are connected to a data read/write amplifier 6, so that the read data/write data are supplied via an input/output buffer 7 between this data read/write amplifier 6 and an input/output pin 8.

Since the switch selecting circuits 3-i are arranged as described above, all of these switch selecting circuits 3-i can be reset by a reset signal RST so that the switch selecting circuits 3-i are set when the signal YSW is non-active. In response to the address information AD, the switch selecting circuit 3 indicated by the address information enforces the signal YSW High level. Therefore the switch selecting circuit 3 sets the transfer signal YSWb to a low level. The circuit 3-i receiving the YSWb inputs the transfer signal YSWb at the low level and outputs the signal YSWb at a high level. That is, the switch selecting circuits 3-i may function as a shift register. For instance, the switch selecting circuit 3-0 selected to the address information sets the signal YSW-0 to a high level, so that the switch circuit 2-0 is selected. In response to the clock signal CLK, the next switch selecting circuit 3-1 is operated. Subsequently, the switch selecting circuits are successively brought into the active conditions, so that the corresponding switch circuits are successively turned ON.

Figure 2:
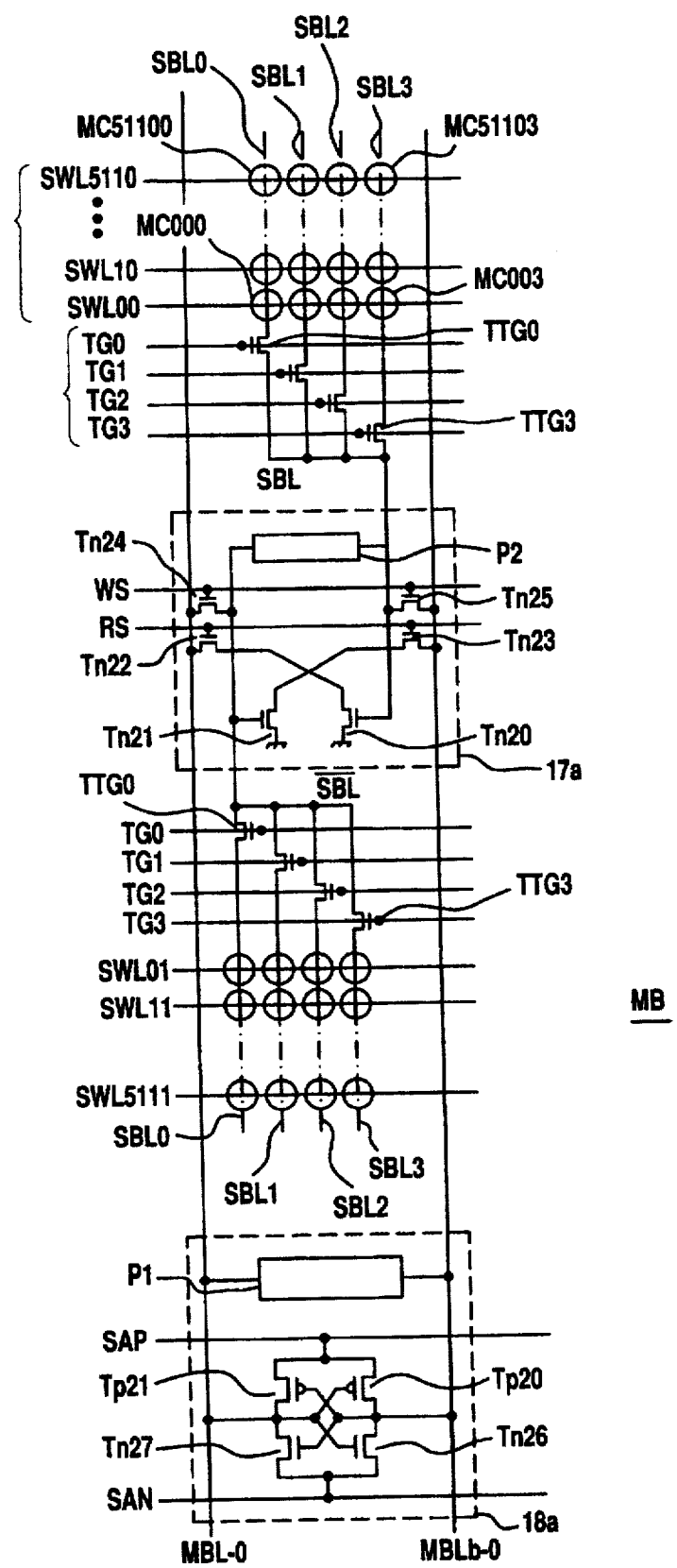
FIG. 2 is the circuit diagram of the memory block MB shown in the DRAM of FIG. 1.

It should also be noted that since an internal arrangement of the memory block MB is the same as that of FIG. 2, this internal arrangement is omitted.

Figure 5:
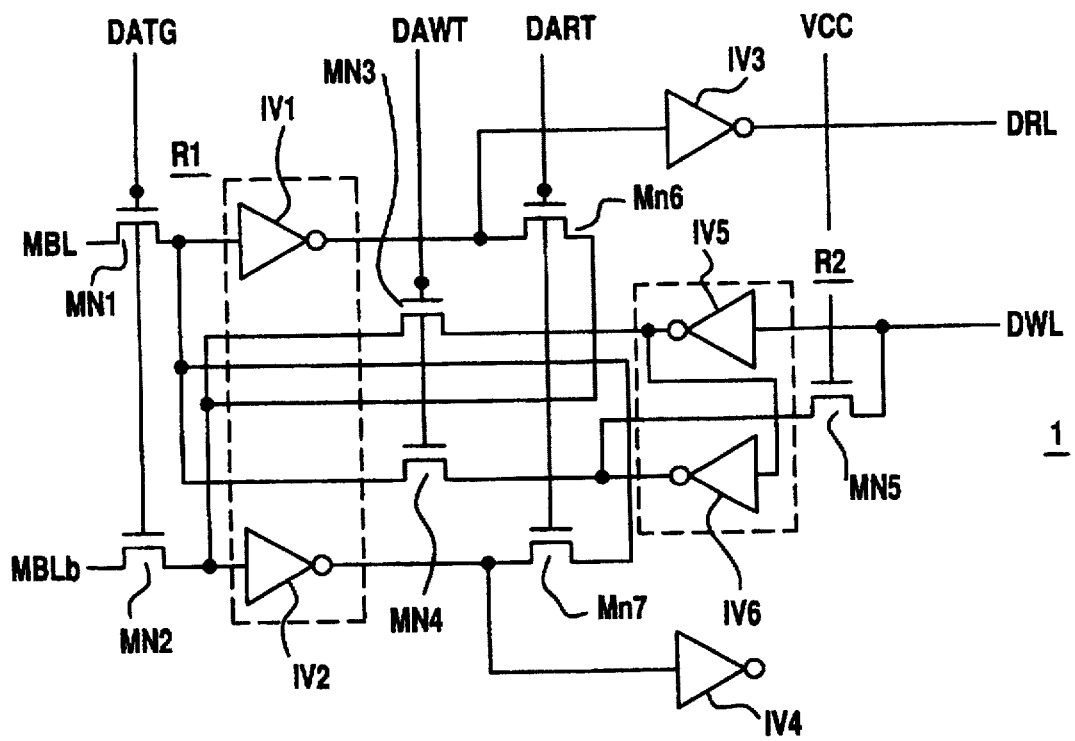
FIG. 5 is a circuit diagram of the latch circuit employed in the DRAM of FIG. 4.

Referring now to FIG. 5, each of the data latch circuits 1-i includes nMOS transistors $MN_1$ and $MN_2$ with respect to the main-bit line pair MBL and MBLb. The data latch signal DATG is supplied to the gates of the nMOS transistors $MN_1$ and $MN_2$. Inverters $IV_1$ and $IV_2$ are connected to the transistors $MN_1$ and $MN_2$. An nMOS transistor $MN_6$ is connected in common with the output of the inverter $IV_1$ and another nMOS transistor $MN_7$ is connected with the output of the inverter $IV_2$. When the data read signal DART becomes active, these nMOS transistors $MN_6$ and $MN_7$ are activated, so that a flip-flop $R_1$ is formed by the inverter $IV_1$ and $IV_2$. The output of the inverter $IV_1$ is connected via an inverter $IV_6$ to the data read line DRL. The output of the inverter $IV_2$ is connected to a dummy inverter $IV_4$. It is provided in order to make the load capacitances of the outputs of the inverters $IV_1$ and $IV_2$ equal to each other. On the other hand, an inverter $IV_5$ is provided with the data write line DWL. The output of this inverter $IV_5$ is connected to the inverter $IV_6$ and the nMOS transistor $MN_3$. The output of the inverter $IV_6$ is connected to the nMOS transistor MN4. Moreover, the inverter IV6 is connected via a MOS transistor $MN_5$ to the line DWL. That is, another flip-flop $R_2$ is formed by the inverters $IV_5$ and $IV_6$. When the data write signal DAWT becomes active, the output of the inverter $IV_5$ is connected to the main bit line MBLb, and the output of the inverter $IV_6$ is connected to the main bit line MBL. The nMOS transistor $MN_5$ may function as a small resistor so as not to transfer the high impedance condition of the data write line DWL to the flip-flop $R_2$ when the write mode is not selected.

During the data reading operation, the signal DART becomes an active high level. Under this condition, a data latch signal DATG is produced as a one-shot pulse, SQ that the read data on the main-bit line pair MBL, MBLb is latched in the flip-flop $R_1$. In other words, since the data read signal DART is in a high level, (signal DAWT is in a low level), the transistors $MN_6$ and $MN_7$ are in an ON state, so that the data of the selected memory cell is written into the flip-flop $R_1$. When the signal DATG is returned to the low level, the transistors $MN_1$ and $MN_2$ are turned OFF, so that the main bit line pair is disconnected from the corresponding latch circuit 1-i. The output from the flip-flop $R_1$, namely the output from the inverter $IV_1$, is transferred via the inverter $IV_2$ to the data read line DRL.

On the other hand, during the data writing operation, the data read signal DART becomes a low level and the data write signal DAWT becomes a high level, so that the write data is latched from the data write line DWL to the flip-flop $R_2$. This data written into the flip-flop $R_2$ is transferred to the main-bit line pair MSL, MSLb when the data latch signal DATG becomes the high level.

Figure 6:
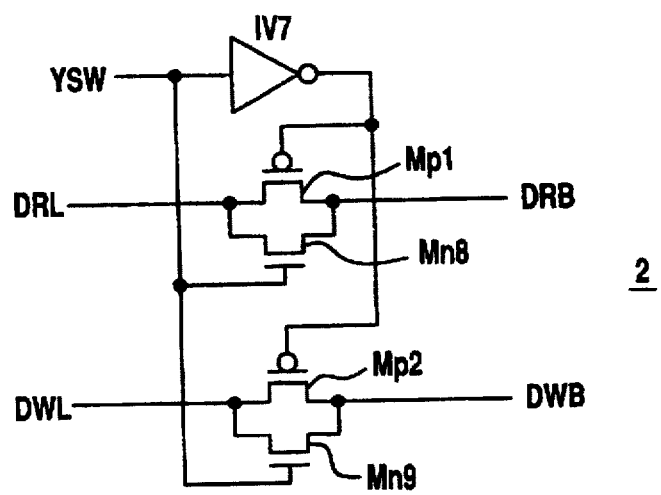
FIG. 6 is a circuit diagram of the switch circuit employed in the DRAM of FIG. 4.

Referring now to FIG. 6, each of the switch circuits 2-i includes pMOS transistors $M_{p1}$, $M_{p2}$, nMOS transistors $M_{n8}$, $M_{n9}$ and inverter $IV_7$. The transistors $M_{p1}$, $M_{n8}$ are provided between the data read line DRL and the data read bus DRB, and another pair of transistors $M_{p2}$ and $M_{n9}$ are provided between the data write line DWL and the data write bus DWB. The switch selecting signal YSW is coupled to the gates of the nMOS transistors $M_{n8}$, $M_{n9}$, whereas a reverse signal of the switch selecting signal YSW is coupled to the gates of the pMOS transistors $M_{p1}$, $M_{p2}$. Accordingly, when the switch selecting signal YSW is in a low level, all of these transistors become non-active, so that the signal path between the data read line DRL and the data read bus DRB, and the signal path between the data write line DWL and the data write bus DWB become non-active, respectively. Conversely, when the switch selecting signal YSW is at a high level, all of these transistors become active. Accordingly, the signal path between the data read line DRL and the data read bus DRB, and the signal path between the data write line DWL and the data write bus DRB are made conductive so that the data are transferred through the respective signal paths.

Figure 7:
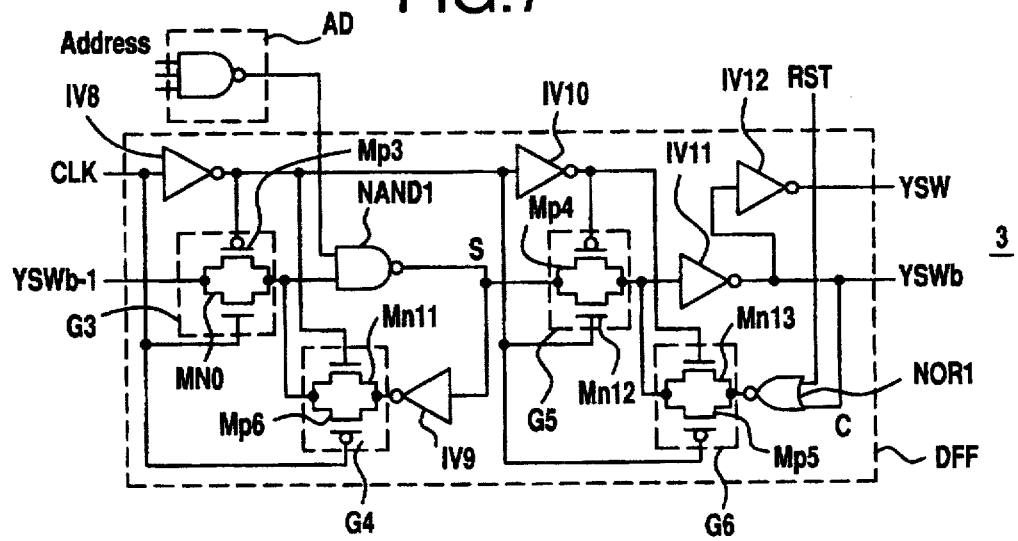
FIG. 7 is a circuit diagram of the switch selection circuit employed in the DRAM of FIG. 4.

Referring now to FIG. 7, each of the switch selecting circuits 3-i includes a data flip-flop DFF and an address decoder AD. The address decoder AD receives the address information. When the address decoder AD is selected, the address decoder AD outputs a low level. The address decoder AD outputs a high level in all other cases. On the other hand, the transfer signal YSWb-1 is inputted via a gate $G_3$ arranged by pMOS transistors $M_{p3}$ and $M_{n10}$ to a NAND circuit $NAND_1$. The NAND circuit $NAND_1$ receives as input the output of the address decoder AD and the transfer signal YSWb-1. The output of the NAND circuit NAND1 is connected to a node "S". This node "S" is connected via an inverter $IV_9$, to the gate $G_4$ which includes a pMOS transistor $M_{p6}$ and an nMOS transistor $M_{n11}$. This node S is further connected to a gate $G_5$ which includes a pMOS transistor $M_{p4}$ and an nMOS transistor $M_{n12}$. The output of the inverter $IV_{11}$ is connected to another inverter $IV_{12}$. The inverters $IV_{11}$ and $IV_{12}$ output the transfer signal YSWb and the switch selecting signal YSW, respectively. The output of the inverter $IV_{11}$ is further connected to a NOR circuit $NOR_1$. The NOR circuit $NOR_1$ inputs a reset signal RST and the transfer signal YSWb. The output of this NOR circuit NOR is connected the gate $G_6$ arranged by an nMOS transistor $M_{n13}$ and a pMOS transistor $M_{p5}$. The gate $G_6$ is connected to the input of the gate inverter $IV_{11}$. A clock signal CLK is entered into the gates $G_3$, $G_4$, $G_5$, $G_6$. When the clock signal CLK is in a high level, the gates $G_3$ and $G_6$ are opened, whereas when the clock signal CLK is in a low level, the gates $G_4$ and $G_5$ are opened.

When the transfer signal YSWb-1 is at a high level and also the output from the address decoder AD is at a high level, the NAND circuit $NAND_1$ outputs a low level at the node S in response to the rising edge of the clock signal CLK. Next, the low level signal at the node S passes through the gate $G_5$ upon receipt of the falling edge of the clock CLK. As a result, the switch selecting signal YSW is set to a low level, and the transfer signal YSWb is set to a high level. When the address decoder AD becomes a low level, or the level of the transfer signal YSWb-1 becomes a low level, the NAND circuit $NAND_1$ outputs a high level at the node "S" upon receipt of the rising edge of the clock CLK independent of the other output levels. Next, in response to the falling edge of the clock signal CLK, the gate $G_5$ causes a high level signal at the node S to pass through, so that the switch selecting signal YSW is set to a high level and the transfer signal YSWb is set to a low level. When the high level of the reset signal RST is inputted, the NOR circuit $NOR_1$ necessarily outputs a low level, so that the transfer signal YSWb is set to a high level.

Next, operations of the DRAM memory shown in FIG. 4 explain as follow. At first, since the reset signal RST is inputted to all of the switch selecting circuits 1-i, the respective switch selecting signals YSW are set to low levels and the transfer signal YSWb are set to a high level.

Next, for example, when the switch selecting circuit 3-0 is selected by the address information, the output of the address decoder AD of the circuit 3-0 becomes a low level. Thus, the switch selecting circuit 3-0 outputs the switch selecting signal YSW-O with the high level and the transfer signal YSWb-O with the low level. Accordingly, in response to the switch selecting signal YSW-O at the high level, the switch circuit 2-0 becomes activate and the data latch circuit 1-0 is connected to the data read/write amplifier 6 electrically to thereby perform the data transfer operation. Then, the transfer signal YSWb-O at the low level is inputted to the switch selecting circuit 3-1 at the post stage, so that the switch selecting circuit 3-1 outputs the switch selecting signal YSW-1 with the high level and the transfer signal YSWb-1 with the low level after 1 clock cycle. At this time, since the transfer signal YSW-3 with the high level is entered into the switch selecting circuit 3-0-and the output of the address decoder AD of the circuit 3-0 turn low level, the switch selecting signal YSW-O is set to a low level and the transfer signal YSWb-O is set to a high level in response to the above-described 1 clock. As a result, the switch circuit 2-0 disconnected the data latch circuit 1-0 with the data read/write amplifier 6 and the switch circuit 2-1 becomes active. As described above, the transfer signal YSW having the high level is successively outputted from the selected switch selecting circuit to the post-staged switch selecting circuits every 1 clock cycle, so that the corresponding data latch circuit 1-1 is successively connected with the data read/write amplifier 6. With the above-described operation, the information of the memory cell latched in the data latch circuits 1-0, 1-1, 1-2, and 1-3 is read from the memory cell at the selected address in a serial manner.

Figure 3:
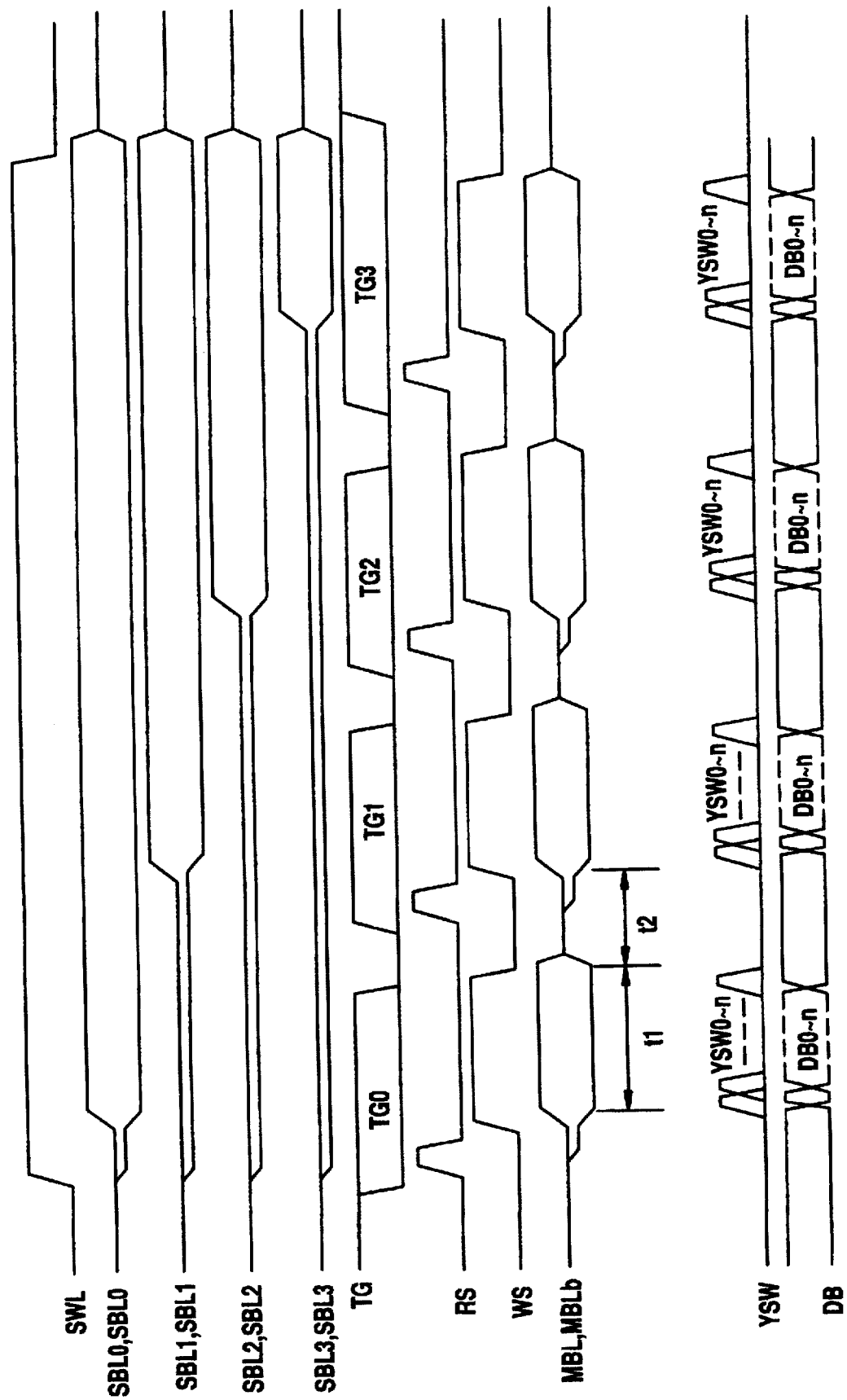
FIG. 3 is the timing chart for representing the reading operation of the DRAM indicated in FIG. 1.
Figure 8:
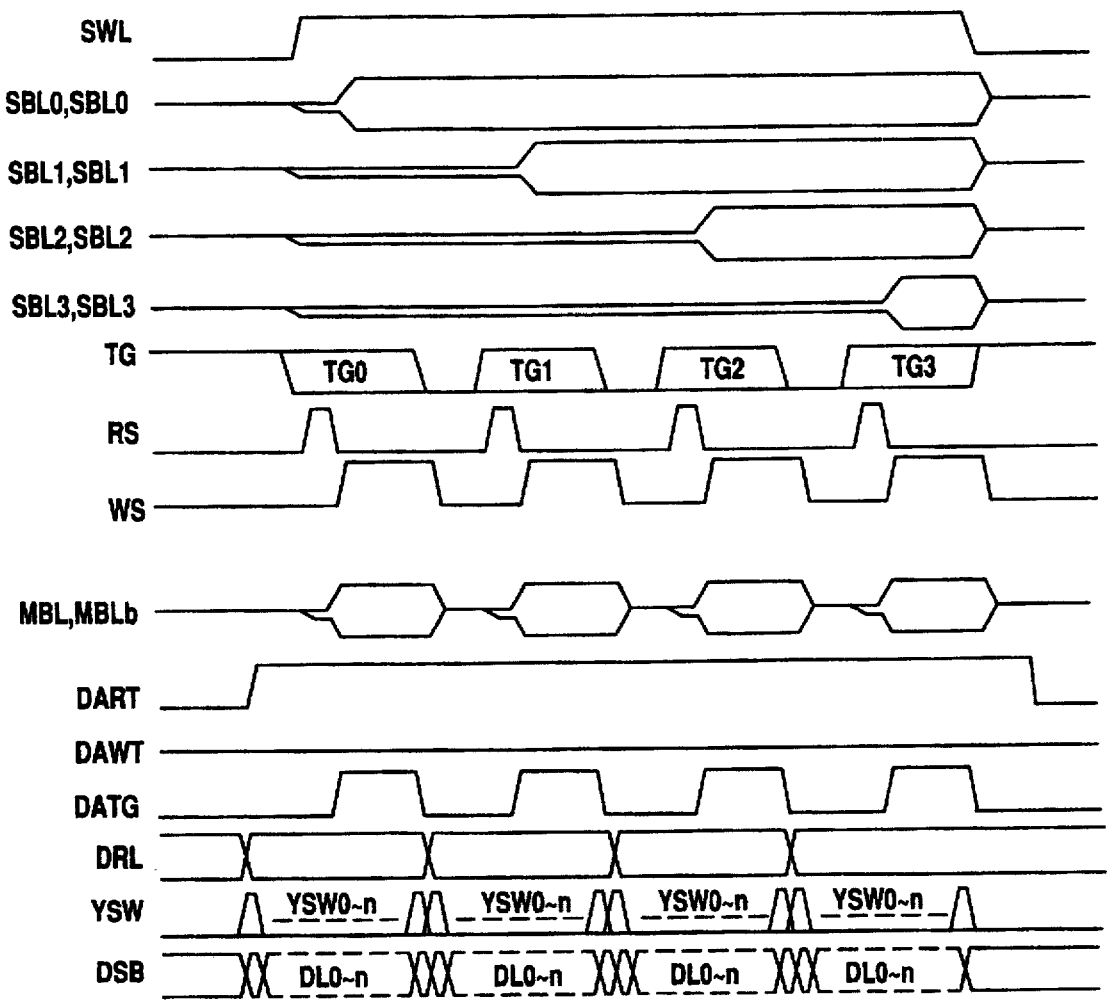
FIG. 8 is a timing chart for indicating data reading operation of the DRAM shown in FIG. 4.

Referring now to FIG. 8, when the operation is in the data read mode, the data read signal DART becomes a high level. As previously explained in connection with FIG. 3, the data of the selected memory cell is read to each of the main-bit line pairs MBL0-3, MBLbO-3. Thereafter, the signal WS becomes a high level and the data of a main-bit line pair is amplified and the data latch signal DATG is produced in an one shot signal. Thereafter, the respective read data are fetched into the data latch circuit 1-0~1-3 and transferred to the data read line DBL0-3. On the other hand, the switch selecting circuit 3-0 is activated by the signal YSW-0 and controls the switch circuit 2-0 to be active. As a result, the read data latched in the latch circuit 1-0 is sequentially read. While this data is read, the respective main-bit line pairs MBL0-3, MBLbO-3 are initialized. Thereafter, the signal $TG_1$ becomes an active level, so that the data appearing on the next sub-bit line SBL1 is sensed and the read data is rewritten.

When the reading operation of the data latched in the latch circuit 1-i is ended, the data latch signal DATG is again produced, and the data derived from the memory cell corresponding to the signal $TG_1$ is latched into the latch circuit 1-i, so that the data reading operation is continued. As a consequence, as shown in FIG. 8, the initializing period of the main bit line pairs can be masked, so that the data reading operation can be continued without any interrupt.

Figure 9:
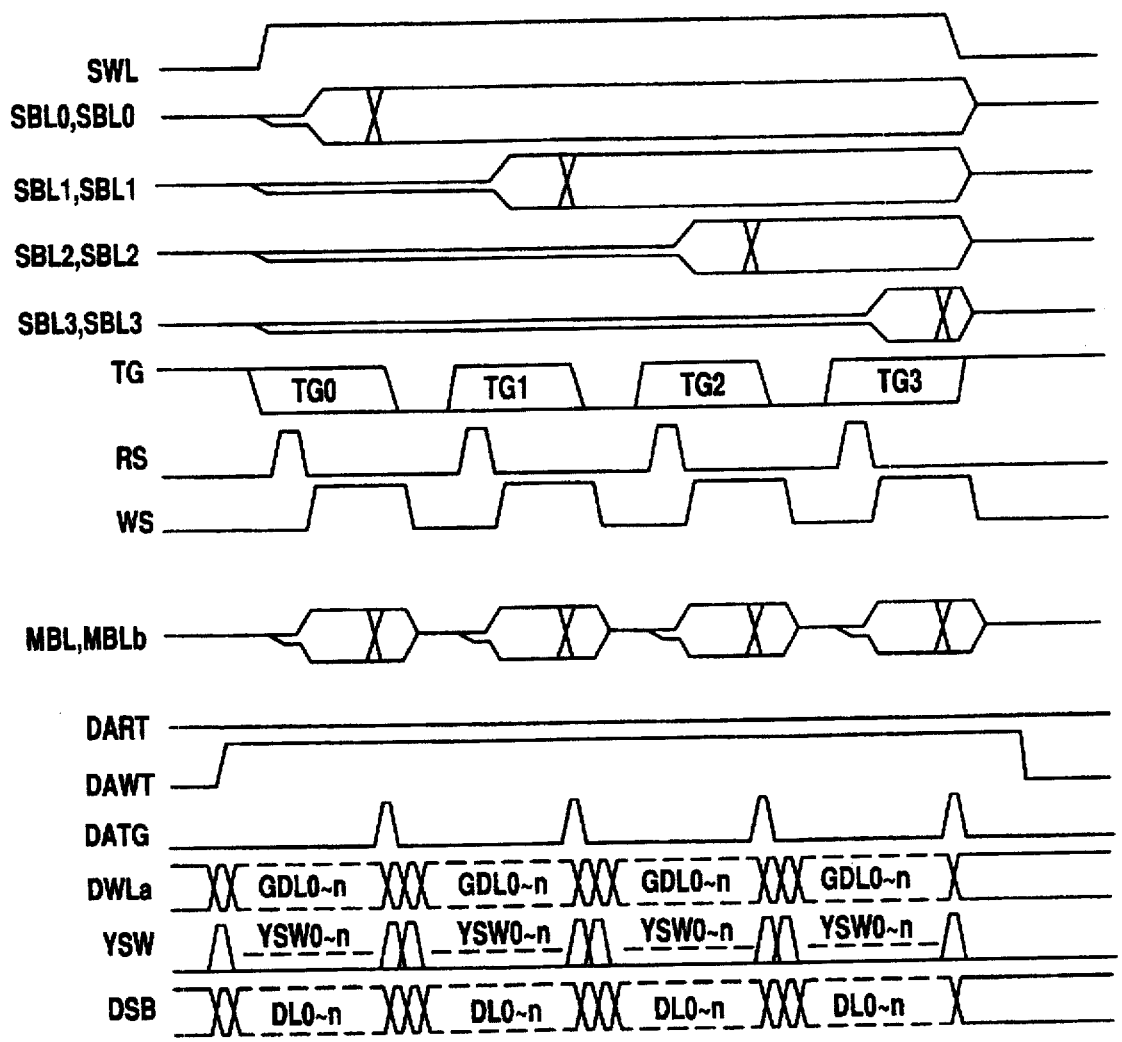
FIG. 9 is a timing chart for indicating data writing operations of the DRAM shown in FIG. 4.

Referring now to FIG. 9, the data write signal DAWT becomes an active high level, the write data are inputted in input/output pin 8 in the serial manner prior to the selection of the word line, and thus these write data are sequentially latched into the latch circuit 1-i. During this operation, the word line is selected, the data of the memory cell selected by the word line is sensed and rewritten, and the data latch signal DATG is produced at a time when the write data are collected in the latch circuit 1-i. As a result, the write data are transferred to the respective main-bit line pair and then are written into the memory cells. Although the initializing operation is thereafter carried out for the main-bit line pair, since the latch circuit 1-i is disconnected, the subsequent write data can be sequentially latched into the latch circuit 1-i.

Figure 10:
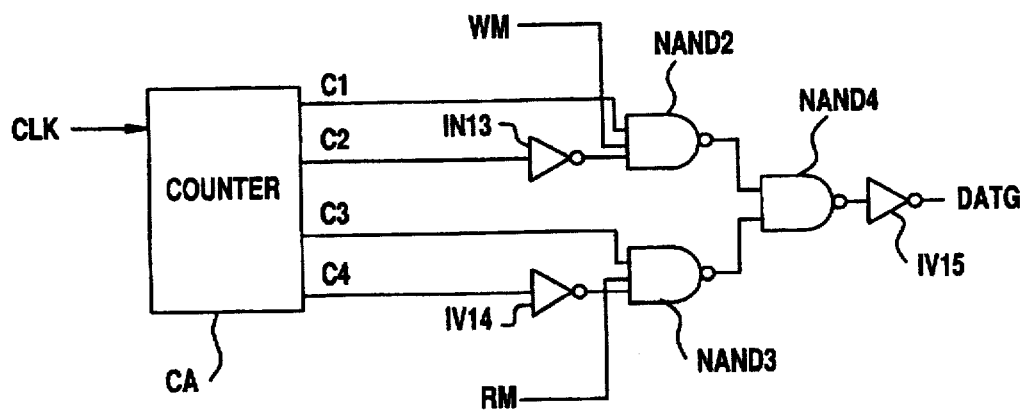
FIG. 10 is a circuit diagram for producing the data latch signal indicated in FIG. 4.
Figure 11:
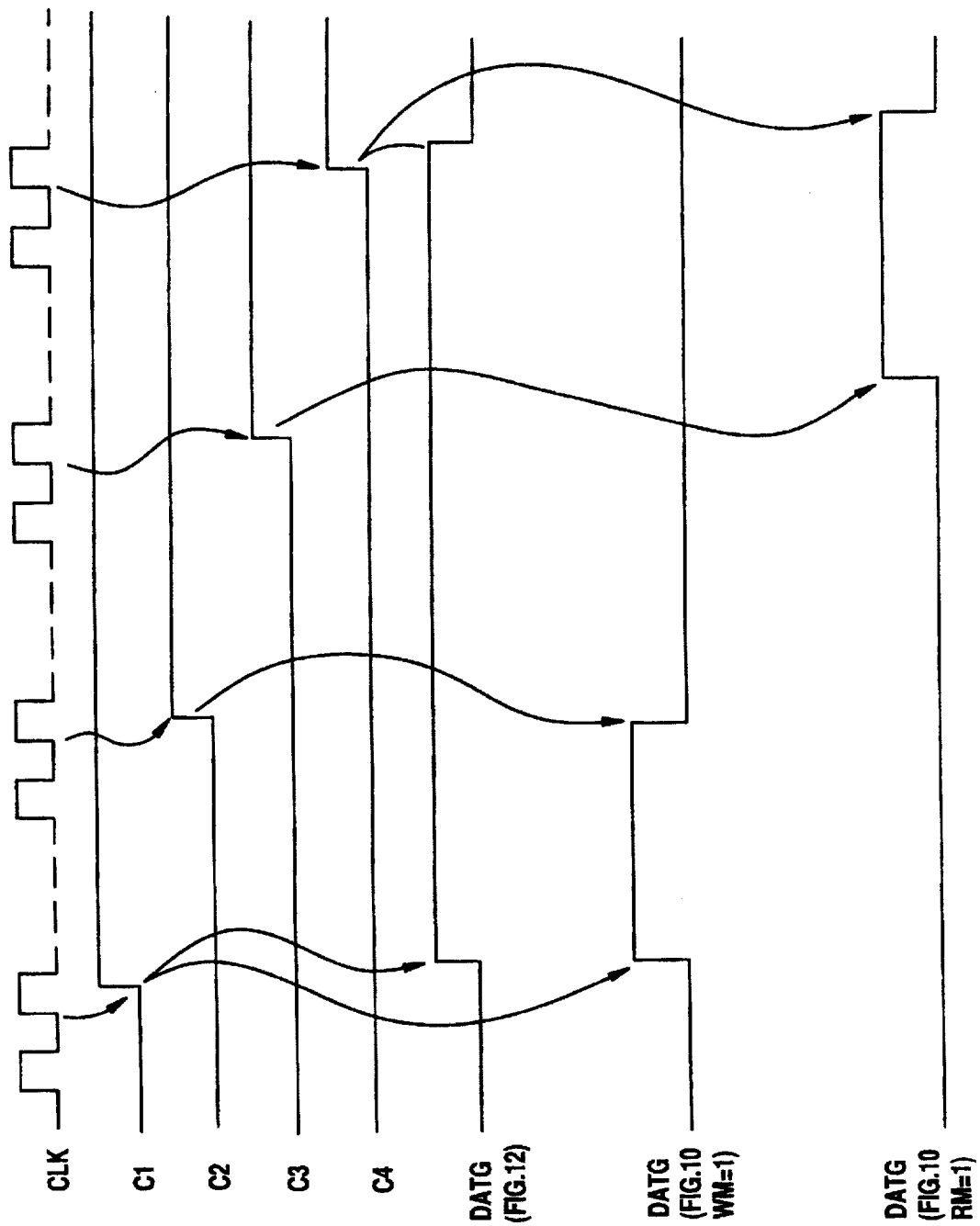
FIG. 11 is a timing chart for indicating the data latch signal generation timing of the data latch signal generating circuit employed in the DRAM of FIG. 4.

FIG. 10 is a circuit diagram of a data latch signal DATG generating circuit according to the first embodiment. FIG. 11 represents a timing chart for the data latch signal DATG generating circuit. A counter CA frequency-divides the clock signal CLK to gene-age timing signals $C_1$ to $C_4$. The timing signals $C_1$ and $C_22$ are supplied to a NAND circuit $D_2$, and an output from this NAND circuit $D_2$ is controlled in response to a write enable signal WM having an active high level. On the other hand, the timing signals $C_3$ and $C_4$ are supplied to a NAND circuit $D_3$, and an output from this NAND circuit $D_3$ is controlled in response to a read enable signal RM having an active high level. As a consequence, the data latch signal DATG is generated by another NAND circuit $NAND_4$ for inputting the outputs derived from the NAND circuits $NAND_2$ and $NAND_3$, and this data latch signal DATG owns different timings during the data reading operation and the data writing operation. This implies that all of the data are not written into this memory during the data writing operation, but since a portion of the data is rewritten by using the original data, after the read data is defined, namely the refresh operation can be sufficiently performed, the data latch signal DATG during the data writing operation is raised.

Figure 12:
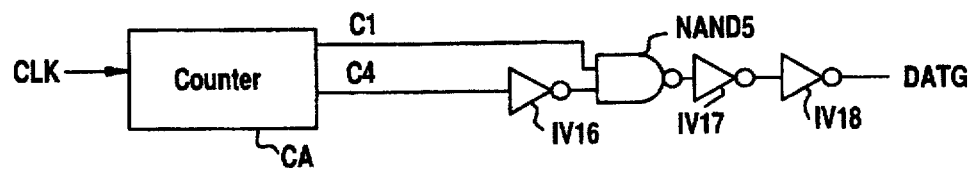
FIG. 12 is a circuit diagram for showing another data latch signal generating circuit.

FIG. 12 is a circuit diagram for showing a data latch signal DATG generating circuit, according to a second embodiment of the present invention, used in the memory. The counter CA inputs the clock signal CLK to thereby produces timing signals $C_1$ and $C_4$. Upon receipt of inverted signals of these timing signals $C_1$ and $C_4$, a data latch signal DATG is generated by a NAND circuit $NAND_5$ (see FIG. 11).

Figure 13:
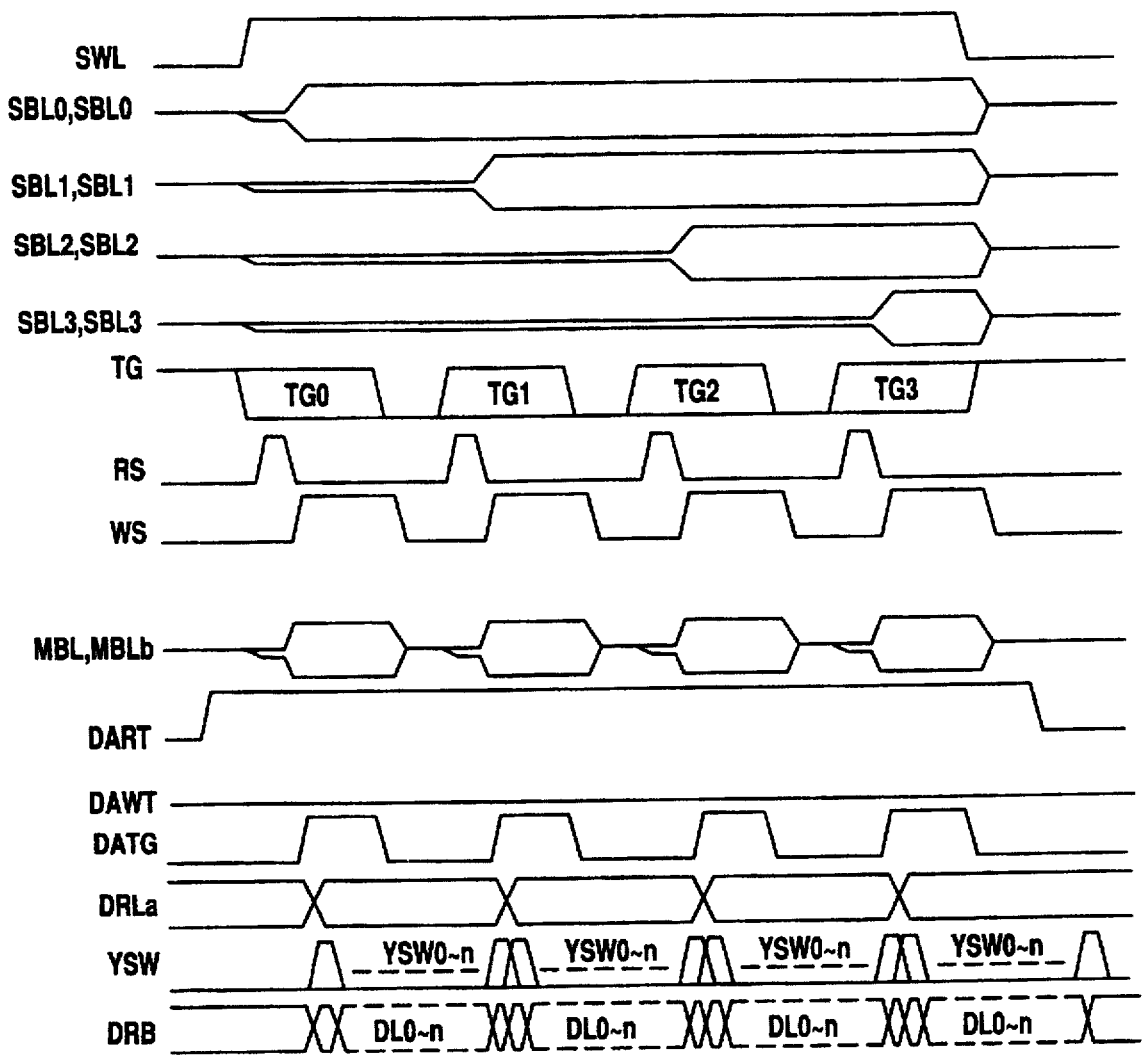
FIG. 13 is a data read timing chart for the DRAM by way of the data latch signal generating circuit of FIG. 12.
Figure 14:
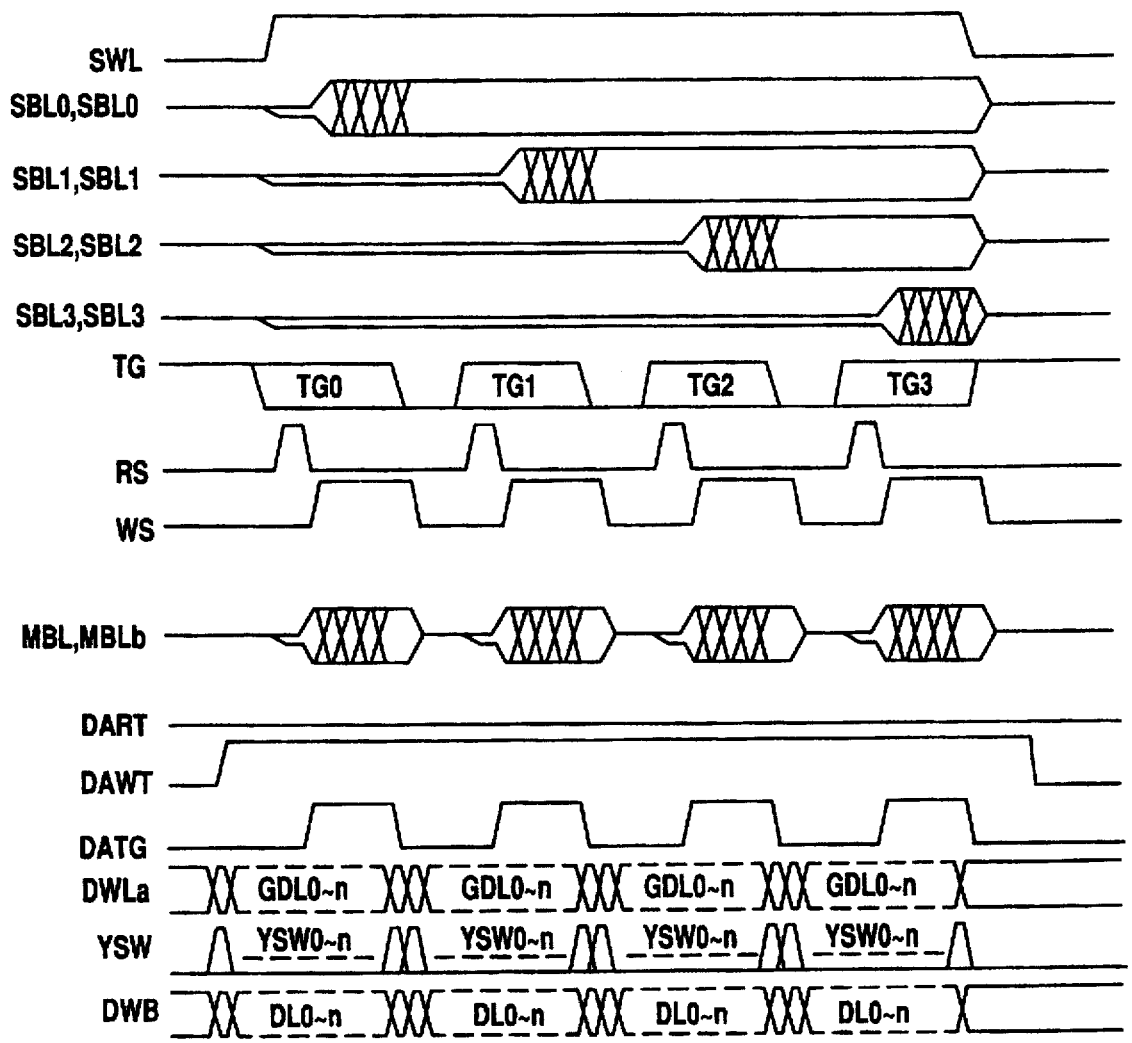
FIG. 14 is a data write timing chart for the DRA11 by way of the data latch signal generating circuit of FIG. 12.

A data read cycle and a data write cycle of the memory to which the data latch signal DATG generating circuit of FIG. 12 has been applied will now be explained with reference to FIG. 13 and FIG. 14 respectively.

In the data read cycle, the information of the memory cell selected by raising the switch selecting signal YSW during a front half period of the rising condition of the data latch signal DATG is transferred to the data read/write amplifier 6 under such a condition that the levels of the main bit line pair MSL and MSLb can be sufficiently defined. In the data write cycle, the writing operation is performed immediately after the write signal DAWT is raised. Since the data latch signal DATG is raised for a long time period, the level corresponding to the data to be written can be written in to the main bit line pairs MBL and MBLb during a sufficiently long time period. As a result, there is such an advantage that the writing level to the memory cell can be improved. Also, there is another advantage that since the data latch signal DATG is activated during the same time period even in the write cycle and the read cycle, the circuit arrangement of this data latch signal generating circuit can be simplified. However, in the actual case, since the cycles are not divided during the data reading operation and the data writing operation similar to that of the first embodiment, the cycles must be sufficiently prolonged in order that the data writing operation is carried out after the read data has been sufficiently defined.

It should be noted that the present invention is not limited to the above-described embodiment, but may be modified. For instance, a total number of the sub-bit lines and/or the word lines may be properly changed. Also, only four sets of the main/sub-bit line arrangements are employed in this embodiment. Alternatively, at least two sets of the main/sub-bit line arrangements are sufficient. Furthermore, the above-described embodiment has described that the levels at the respective wire lines were defined at the high levels or the low levels. Alternatively, these levels may be properly changed. Accordingly, the characteristics and the conducting types of these pMOS transistors/nMOS transistors are varied in accordance with the above level changes.

As previously described in detail, since the sensing operations of the main bit lines can be performed while the data is read and written, the data can be read/written without any interruption. As a consequence, the present invention can provide such an advantage that the data transfer efficiency can be increased.

What is claimed is:

1. A semiconductor memory device comprising:
 a plurality of sub-bit lines;
 a sense amplifier provided in common to said plurality of sub-bit lines and receiving a data signal from a first one of said plurality of sub-bit lines;
 a main-bit line operatively coupled to said sense amplifier to receive an output of said sense amplifier;
 a data latch circuit provided to latch data appearing on said main-bit line; and
 means for transferring a data signal of a second one of said plurality of sub-bit lines to said sense amplifier during said data latch circuit being accessed to read out data latched in said data latch circuit.

2. The semiconductor memory device as claimed in claim 1, wherein said sense amplifier responds to the data signal of said second one of said plurality of bit lines and drives said main-bit line during said data latch circuit being accessed.

3. The semiconductor memory device as claimed in claim 1, further comprising an additional sense amplifier coupled to drive said main-bit line in response to the output of said sense amplifier, said data latch circuit being activated to latch the data on said main-bit line after said additional sense amplifier drives said main-bit line.

4. A semiconductor memory device comprising:
 a plurality of sub-bit lines;
 a sense amplifier provided in common to said plurality of sub-bit lines;
 a main-bit line coupled to said sense amplifier;
 a data latch circuit temporarily latching first data to be written,
 first means for transferring said first data from said data latch circuit to said main bit line to thereby allow said sense amplifier to drive a first one of said sub-bit lines in response to said first data; and
 second means for disconnecting said data latch circuit from said main-bit line when said data latch circuit is being controlled to latch second data to be written, to thereby allow said sense amplifier to prepare for driving a second one of said sub-bit lines in response to said second data.

5. A semiconductor memory device comprising:
 a plurality of sub-bit lines, said sub-bit lines being divided into a plurality of groups each having plural sub-bit lines;
 a plurality of word lines intersecting each of said sub-bit lines;
 a plurality of memory cells disposed at intersections of said sub-bit lines and said word lines;
 a plurality of sense amplifiers each provided in common to an associated one of said groups of sub-bit lines to receive a data signal from a first one of said sub-bit lines belonging to said associated one of said groups of sub-bit lines;
 a plurality of main-bit lines each operatively coupled to an associated one of said sense amplifiers;
 a plurality of data latch circuits each provided for an associated one of said main-bit lines to latch data appearing on said associated one of said main-bit lines; and
 means for transferring a data signal of a second one of said sub-bit lines belonging to each of said groups of sub-bit lines to a corresponding one of said sense amplifiers when each of said data latch circuits is being accessed to read out data latched therein.

6. The semiconductor memory device as claimed in claim 5, wherein said data latch circuits are accessed in sequence to read the data latched in said data latch circuits in series.

7. A semiconductor memory device comprising:
 a plurality of first sub-bit lines;
 a plurality of second sub-bit lines;
 first and second sense amplifiers provided respectively to said plurality of first and second sub-bit lines;
 first and second main-bit lines provided respectively to said first and second sense amplifiers;
 first and second data latch circuits provided respectively to said first and second main-bit lines;
 a data read bus provided to said first and second data latch circuits;
 a data write bus provided to said first and second data latch circuits;
 read means for said first amplifier receiving a first read-data from a first one of said plurality of first sub-bit lines, said second amplifier receiving a second read-data from a first one of said plurality of second sub-bit lines said first data latch circuit latching said first read-data appearing on said first main-bit line, said second data latch circuit latching said second read-data appearing on said second main-bit line, and switching from said first one of said plurality of first sub-bit lines to a second one thereof and from said first one of said plurality of second sub-bit lines to a second one thereof to access said second one of said plurality of first and second sub-bit lines during said first and second data latch circuits being accessed to read out said first and second read-data latched in said first and second data latch circuits into said data read bus;

write means for transferring a first write-data latched in said first data latch circuit via said first main-bit line to said first one of said plurality of first sub-bit lines and a second write-data latched in said second data latch circuit via said second main-bit line to said first one of said plurality of second sub-bit lines, and switching from said first one of said plurality of first sub-bit lines to said second one thereof and from said first one of said plurality of second sub-bit lines to said second one thereof to access said second one of said plurality of first and second sub-bit lines when said first and second data latch circuits are being accessed to latch a third write-data and a fourth write-data respectively to be written into said second one of said plurality of first and second sub-bit lines.

8. The semiconductor memory device as claimed in claim 7, wherein said data latch circuit inputs a data latch signal, a read signal and a write signal, said data latch circuit having a first flip-flop formed by said read signal being active and latching said read data in said first flip-flop when said data latch signal becomes active while said read signal is active, a second flip-flop latching said write data appearing on said data write bus by said write signal being active and transferring the latched data of said second flip-flop to said main-bit line when said data latch signal becomes active during said write signal being active.

* * * * *